United States Patent
Han et al.

(10) Patent No.: US 12,210,069 B2
(45) Date of Patent: Jan. 28, 2025

(54) BATTERY SOH ESTIMATING APPARATUS AND METHOD

(71) Applicant: LG ENERGY SOLUTION, LTD., Seoul (KR)

(72) Inventors: Hyun Han, Daejeon (KR); Gyu-Yeol Lee, Daejeon (KR); Ji-Hoon Jang, Daejeon (KR); Soo-Bin Song, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 136 days.

(21) Appl. No.: 18/033,246

(22) PCT Filed: Jun. 14, 2022

(86) PCT No.: PCT/KR2022/008406
§ 371 (c)(1),
(2) Date: Apr. 21, 2023

(87) PCT Pub. No.: WO2022/265357
PCT Pub. Date: Dec. 22, 2022

(65) Prior Publication Data
US 2024/0027536 A1   Jan. 25, 2024

(30) Foreign Application Priority Data
Jun. 17, 2021 (KR) .................. 10-2021-0078998

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/374* (2019.01); *G01R 31/3842* (2019.01)

(58) Field of Classification Search
None
See application file for complete search history.

(56) References Cited

U.S. PATENT DOCUMENTS

| 2007/0001679 A1 | 1/2007 | Cho et al. |
| 2010/0036626 A1 | 2/2010 | Kang et al. |

(Continued)

FOREIGN PATENT DOCUMENTS

| JP | 2006-058114 A | 3/2006 |
| JP | 2019-061741 A | 4/2019 |

(Continued)

OTHER PUBLICATIONS

International Search Report (with translation) and Written Opinion dated Sep. 15, 2022, for corresponding International Patent Application No. PCT/KR2022/008406.

(Continued)

*Primary Examiner* — Jas A Sanghera
(74) *Attorney, Agent, or Firm* — Morgan, Lewis & Bockius LLP

(57) ABSTRACT

A battery SOH estimating apparatus according to an embodiment of the present disclosure includes a SOH estimating unit configured to estimate a first SOH of a battery based on the measured voltage and current of the battery; a SOC change calculating unit configured to calculate a SOC change region and a SOC change amount of the battery based on the measured voltage; a weight calculating unit configured to calculate a weight based on a SOC region factor calculated by comparing the SOC change region with a preset criterion SOC region, a SOC change amount factor based on the SOC change amount, and a temperature factor based on the measured temperature of the battery; and a SOH correcting unit configured to correct the first SOH according to the calculated weight and a preset second SOH.

19 Claims, 5 Drawing Sheets

(51) Int. Cl.
*G01R 31/374* (2019.01)
*G01R 31/3842* (2019.01)

(56) References Cited

U.S. PATENT DOCUMENTS

| | | |
|---|---|---|
| 2012/0035873 A1 | 2/2012 | Kang et al. |
| 2013/0278221 A1* | 10/2013 | Maeda ................ G01R 31/392 |
| | | 320/134 |
| 2014/0009123 A1 | 1/2014 | Park et al. |
| 2015/0120225 A1 | 4/2015 | Kim |
| 2015/0268309 A1 | 9/2015 | Kim |
| 2015/0301122 A1 | 10/2015 | Lee |
| 2019/0195956 A1 | 6/2019 | Lim et al. |
| 2019/0285704 A1 | 9/2019 | Lee |
| 2020/0341067 A1 | 10/2020 | Ruan et al. |

FOREIGN PATENT DOCUMENTS

| | | |
|---|---|---|
| JP | 6867478 B2 | 4/2021 |
| KR | 10-0756837 B1 | 9/2007 |
| KR | 10-2010-0019249 A | 2/2010 |
| KR | 10-1509001 B1 | 4/2015 |
| KR | 10-2015-0120697 A | 10/2015 |
| KR | 10-2016-0051047 A | 5/2016 |
| KR | 10-2019-0075684 A | 7/2019 |
| KR | 10-2177721 B1 | 11/2020 |
| KR | 10-2021-0067227 A | 6/2021 |
| WO | 2018/211824 A1 | 11/2018 |

OTHER PUBLICATIONS

The extended European Search Report (EESR) dated Apr. 9, 2024, issued in corresponding EP Patent Application No. 22825282.1. (Note: US 2010/0036626 A1 and US 2015/0120225 A1 were previously cited).

* cited by examiner

| NUMBER OF SOC REGIONS | SOC REGION FACTOR |
|---|---|
| 3 | 1 |
| 2 | 0.66 |
| 1 | 0.33 |

| SOC CHANGE AMOUNT(△SOC) | SOC CHANGE AMOUNT FACTOR |
|---|---|
| 100% | 1 |
| ⋮ | ⋮ |
| 50% | 0.5 |
| ⋮ | ⋮ |
| 0% | 0 |

| TEMPERATURE | TEMPERATURE FACTOR |
|---|---|
| 25°C or higher | 1 |
| ⋮ | ⋮ |
| 15°C | 0.5 |
| ⋮ | ⋮ |
| 0°C or below | 0 |

BATTERY SOH ESTIMATING APPARATUS AND METHOD

TECHNICAL FIELD

The present application claims priority to Korean Patent Application No. 10-2021-0078998 filed on Jun. 17, 2021, in the Republic of Korea, the disclosures of which are incorporated herein by reference.

The present disclosure relates to a battery SOH estimating apparatus and method, and more particularly, to a battery SOH estimating apparatus and method capable of more accurately estimating a SOH of a battery.

BACKGROUND ART

Recently, the demand for portable electronic products, such as notebook computers, video cameras and portable telephones has increased sharply, and electric vehicles, energy storage batteries, robots, satellites, and the like, have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries, and the like. Among them, the lithium batteries are in the limelight since they have almost no memory effect compared to nickel-based batteries and also have very low self-discharging rate and high energy density.

The battery capacity of such a battery decreases depending on the usage environment, usage period, the number of times of charging and discharging, etc. The state of health (SOH) of a battery is an index indicating how much the battery capacity has decreased from the initial battery capacity, and is one of the important parameters for evaluating the lifespan of a battery.

In general, the ampere counting method may be used to estimate the SOH of the battery. The ampere counting method is a method of estimating the SOH of a battery by measuring the battery capacity by the ampere counting method through full charge and full discharge, and comparing it with the initial battery capacity. This method may estimate the SOH of the battery very accurately if the variation of temperature or discharging rate may be properly compensated for, but it is not efficient because the battery must be fully charged and then fully discharged. In addition, when the offset is changed due to deterioration of a current sensor that measures the current of the battery, errors are accumulated during the ampere counting process, so the estimation result may be inaccurate.

DISCLOSURE

Technical Problem

The present disclosure is designed to solve the problems of the related art, and therefore the present disclosure is directed to providing a battery SOH estimating apparatus and method that may more accurately estimate the SOH of a battery by correcting the estimated SOH of the battery based on a SOC change amount, a SOC change region, and a temperature of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery SOH estimating apparatus according to one aspect of the present disclosure may comprise a SOH estimating unit configured to estimate a first SOH of a battery based on the measured voltage and current of the battery; a SOC change calculating unit configured to calculate a SOC change region and a SOC change amount of the battery based on the measured voltage; a weight calculating unit configured to calculate a weight based on a SOC region factor calculated by comparing the SOC change region with a preset criterion SOC region, a SOC change amount factor based on the SOC change amount, and a temperature factor based on the measured temperature of the battery; and a SOH correcting unit configured to correct the first SOH according to the calculated weight and a preset second SOH.

The weight calculating unit may be configured to calculate the SOC region factor according to whether at least a part of the SOC change region belongs to the criterion SOC region.

The criterion SOC region may include a plurality of SOC regions.

The weight calculating unit may be configured to calculate the SOC region factor according to whether at least a part of the SOC change region belongs to each of the plurality of SOC regions.

The weight calculating unit may be configured to calculate the number of SOC regions including at least a part of the SOC change region among the plurality of SOC regions, and to calculate the SOC region factor according to the calculated number.

The weight calculating unit may be configured to calculate the SOC change amount factor to be proportional to the SOC change amount, and to calculate the temperature factor according to a region to which the temperature of the battery belongs among a plurality of preset temperature regions.

The weight calculating unit may be configured to calculate the weight by multiplying the SOC region factor, the SOC change amount factor, and the temperature factor.

The SOH correcting unit may be configured to correct the first SOH using the following equation.

$$SOH_{MOD} = (SOH_1 \times \alpha) + (SOH_2 \times (1-\alpha)) \quad \text{[Equation]}$$

Here, $SOH_{MOD}$ is the corrected first SOH, $SOH_1$ is the first SOH, $SOH_2$ is the second SOH, and $\alpha$ is the weight that is 0 or more and 1 or less.

The SOH estimating unit may be configured to estimate the first SOH in a present cycle based on the voltage and current of the battery measured in the present cycle.

The SOH correcting unit may be configured to correct the first SOH according to the weight and the second SOH preset prior to the present cycle.

The second SOH may be the first SOH corrected in a previous cycle prior to the present cycle.

A battery pack according to another aspect of the present disclosure may comprise the battery SOH estimating apparatus according to an aspect of the present disclosure.

A battery SOH estimating method according to another aspect of the present disclosure may comprise: a SOH estimating step of estimating a first SOH of a battery based on the measured voltage and current of the battery; a SOC change calculating step of calculating a SOC change region and a SOC change amount of the battery based on the measured voltage; a weight calculating step of calculating a weight based on a SOC region factor calculated by comparing the SOC change region with a preset criterion SOC region, a SOC change amount factor based on the SOC change amount, and a temperature factor based on the measured temperature of the battery; and a SOH correcting step of correcting the first SOH according to the calculated weight and a preset second SOH.

Advantageous Effects

According to one aspect of the present disclosure, the battery SOH may be more accurately estimated since not only the voltage, current, and SOC change amount of the battery, but also the result of comparing the SOC change region of the battery and the criterion SOC region are further considered.

The effects of the present disclosure are not limited to the above, and other effects not mentioned herein will be clearly understood by those skilled in the art from the appended claims.

BRIEF DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

EMBODIMENTS OF THE PRE SENT DISCLOSURE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number, such as "first," "second," and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
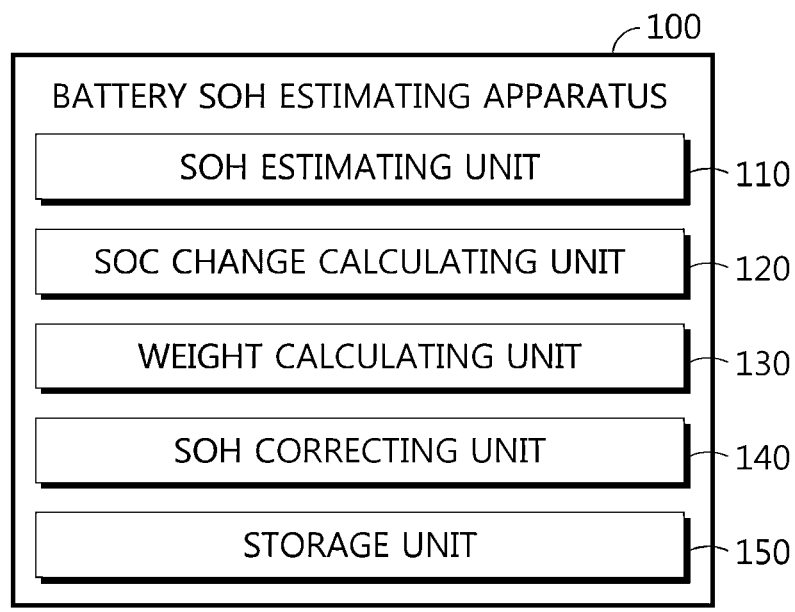
FIG. 1 is a diagram schematically showing a battery SOH estimating apparatus according to an embodiment of the present disclosure.

FIG. 1 is a diagram schematically showing a battery SOH estimating apparatus 100 according to an embodiment of the present disclosure.

Referring to FIG. 1, the battery SOH estimating apparatus 100 may include a SOH estimating unit 110, a SOC change calculating unit 120, a weight calculating unit 130, and a SOH correcting unit 140.

The SOH estimating unit 110 may be configured to estimate a first SOH of a battery based on the measured voltage and current of the battery.

Here, the battery refers to one physically separable independent cell having a negative electrode terminal and a positive electrode terminal. For example, a lithium-ion battery or a lithium polymer cell may be regarded as the battery. In addition, the battery may refer to a battery module in which a plurality of cells are connected in series and/or in parallel. Hereinafter, for convenience of description, the battery will be described as meaning one independent cell.

The SOH estimating unit 110 may receive battery information about voltage, current, and temperature of the battery from the outside or may store the same in advance. Alternatively, the SOH estimating unit 110 may be configured to directly measure the voltage, current, and temperature of the battery.

In addition, the SOH estimating unit 110 may estimate a first SOH of the battery based on the voltage and current of the battery.

For example, the SOH estimating unit 110 may estimate the first SOH of the battery based on the change in capacity of the battery. The SOH estimating unit 110 may estimate a corresponding state of charge (SOC) from the voltage of the battery.

Here, an SOC profile representing a corresponding relationship between the voltage of the battery and the SOC may be preset, and the SOH estimating unit 110 may estimate the corresponding SOC from the voltage of the battery based on the SOC profile. Alternatively, the SOC profile may be preset to represent a corresponding relationship among the voltage, temperature, and SOC of the battery. In this case, the SOH estimating unit 110 may estimate the SOC corresponding to the voltage and temperature of the battery based on the SOC profile.

In addition, the SOH estimating unit 110 may calculate the capacity Q of the battery based on the estimated SOC and the battery current. Thereafter, the SOH estimating unit 110 may estimate the first SOH of the battery by calculating a ratio between a preset criterion capacity Qref and the calculated capacity Q for the battery. Here, the criterion capacity Qref is a preset value of the capacity of a battery in a BOL (Beginning of life) state and may be a capacity value corresponding to the OCV of the battery calculated by the SOH estimating unit 110.

As another example, the SOH estimating unit 110 may estimate the first SOH of the battery based on the change in internal resistance of the battery. The SOH estimating unit 110 may estimate the internal resistance R of the battery from the voltage and current of the battery based on Ohm's law. In addition, the SOH estimating unit 110 may estimate the first SOH of the battery by calculating a ratio between a preset criterion resistance Rref and the calculated internal resistance R for the battery. Here, the criterion resistance Rref may be a preset value of the internal resistance of a battery in a BOL state.

The first SOH of the battery estimated by the SOH estimating unit 110 may be an SOH value based on the voltage and current of the battery measured in the present cycle.

The SOC change calculating unit 120 may be configured to calculate the SOC change region and the SOC change amount of the battery based on the measured voltage.

Specifically, the measured battery voltage may be plural. Preferably, the voltage of the battery may be measured during charging and/or discharging, and may include a start voltage and an end voltage. In addition, the SOC change calculating unit 120 may estimate the SOCs for the measured voltages (start voltage and end voltage) with reference to the SOC profile. The SOC change calculating unit 120 may calculate an SOC change region including the estimated SOCs. Also, the SOC change calculating unit 120 may calculate the SOC change amount by calculating a difference between the estimated SOCs.

For example, it is assumed that the measured battery voltages are V1 and V2, and the battery is charged from voltage V1 to voltage V2. The SOC change calculating unit 120 may estimate SOC1 corresponding to the voltage V1 and SOC2 corresponding to the voltage V2, respectively. The SOC change calculating unit 120 may calculate the SOC change region including SOC1 and SOC2 by setting the start SOC of the SOC change region to SOC1 and setting the end SOC of the SOC change region to SOC2. Also, the SOC change calculating unit 120 may calculate the SOC change amount by calculating the formula of "|SOC2−SOC1|". Here, the SOC change amount may be expressed as $\Delta$SOC, and may be calculated as a value of 0% or more and 100% or less.

The weight calculating unit 130 may be configured to calculate the weight based on a SOC region factor calculated by comparing the SOC change region with a preset criterion SOC region, a SOC change amount factor based on the SOC change amount, and a temperature factor based on the measured temperature of the battery.

Specifically, the weight calculating unit 130 may receive the temperature of the battery from the outside or store the same in advance. Alternatively, the weight calculating unit 130 may be configured to directly measure the temperature of the battery.

In addition, the weight calculating unit 130 may be configured to calculate the SOC region factor, the SOC change amount factor, and the temperature factor, respectively.

Here, the SOC region factor may be calculated according to whether the preset criterion SOC region and the SOC change region calculated by the SOC change calculating unit 120 overlap. For example, the weight calculating unit may calculate the SOC region factor according to whether at least a part of the SOC change region belongs to the criterion SOC region. A specific embodiment of calculating the SOC region factor will be described later in detail with reference to FIGS. 3 to 5.

The SOC change amount factor is a factor calculated based on the SOC change amount calculated by the SOC change calculating unit 120. For example, the weight calculating unit 130 may calculate the SOC change amount factor to be proportional to the SOC change amount. A specific embodiment of calculating the SOC change amount factor will be described in detail later with reference to FIG. 6.

The temperature factor is a factor calculated based on the temperature of the battery. For example, the weight calculating unit 130 may calculate the temperature factor to be proportional to the temperature of the battery. A specific embodiment of calculating the temperature factor will be described later in detail with reference to FIG. 7.

Also, the weight calculating unit 130 may be configured to calculate a weight based on the calculated SOC region factor, the calculated SOC change amount factor, and the calculated temperature factor. For example, the weight calculating unit 130 may calculate the weight by multiplying the SOC region factor, the SOC change amount factor, and the temperature factor. Here, the weight calculated by the weight calculating unit 130 may be set to have a value of 0 or more and 1 or less.

The SOH correcting unit 140 may be configured to correct the first SOH according to the calculated weight and a preset second SOH.

Specifically, the first SOH estimated based on the voltage and current by the SOH estimating unit 110 may be corrected based on the weight and the second SOH by the SOH correcting unit 140.

Figure 2:
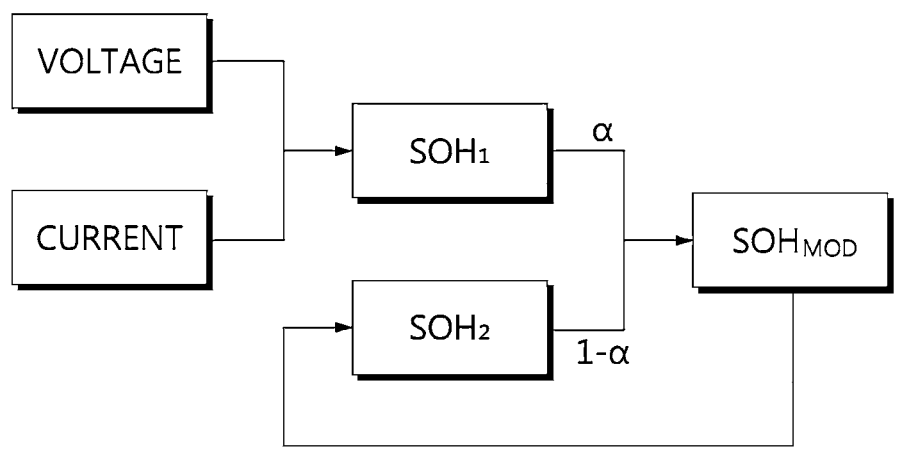
FIG. 2 is a diagram schematically showing the SOH estimating process by the battery SOH estimating apparatus according to an embodiment of the present disclosure.

FIG. 2 is a diagram schematically showing the SOH estimating process by the battery SOH estimating apparatus 100 according to an embodiment of the present disclosure.

Referring to FIG. 2, the first SOH ($SOH_1$) may be estimated based on the voltage and current of the battery. In addition, the first SOH ($SOH_1$) may be corrected based on the second SOH ($SOH_2$) and the weight ($\alpha$), and the corrected first SOH ($SOH_{MOD}$) may be calculated.

For example, the SOH correcting unit 140 may be configured to correct the first SOH using the following equation.

$$SOH_{MOD} = (SOH_1 \times \alpha) + (SOH_2 \times (1-\alpha))  \quad \text{[Equation]}$$

Here, $SOH_{MOD}$ is the corrected first SOH, $SOH_1$ is the first SOH, $SOH_2$ is the second SOH, and $\alpha$ is a weight that may be 0 or more and 1 or less.

In the embodiment according to the above equation, the SOH correcting unit 140 may multiply the first SOH ($SOH_1$) by the weight ($\alpha$) and multiply the second SOH ($SOH_2$) by the complement ($1-\alpha$) for the weight ($\alpha$). In addition, the SOH correcting unit 140 may calculate the corrected first SOH ($SOH_{MOD}$) by adding the first SOH ($SOH_1$) multiplied by weight ($\alpha$) and the second SOH ($SOH_2$) multiplied by the complement ($1-\alpha$).

Referring to FIG. 2 further, the SOH estimating unit 110 may be configured to estimate the first SOH ($SOH_1$) in the present cycle based on the voltage and current of the battery measured in the present cycle.

Specifically, the SOH estimating unit 110 may estimate the first SOH ($SOH_1$) in the present cycle of the battery based on the voltage and current of the battery measured in each charging and discharging cycle of the battery. In addition, the SOH correcting unit 140 may be configured to correct the first SOH ($SOH_1$) according to the weight ($\alpha$) and the second SOH (SOW preset prior to the present cycle.

Also, referring to FIG. 2, the second SOH ($SOH_2$) may be the first SOH ($SOH_{MOD}$) corrected in a previous cycle prior to the present cycle. That is, the corrected SOH ($SOH_{MOD}$) calculated in the present cycle may be used as the second SOH ($SOH_2$) in the next cycle.

The battery SOH estimating apparatus 100 according to an embodiment of the present disclosure has an advantage of more accurately estimating the battery SOH by considering not only the voltage, current, and SOC change amount of the battery but also the result of comparing the SOC change region of the battery and the criterion SOC region.

In addition, as the charging and discharging cycle of the battery progresses, the battery SOH estimating apparatus 100 may recursively estimate the SOH of the battery in the present cycle by considering the SOH (second SOH) of the battery estimated in the previous cycle and the weight calculated in the present cycle, and thus has an advantage of improving the SOH estimation accuracy of the battery.

Meanwhile, the SOH estimating unit 110, the SOC change calculating unit 120, the weight calculating unit 130 and the SOH correcting unit 140 included in the battery SOH estimating apparatus 100 may optionally include an application-specific integrated circuit (ASIC), another chipset, a logic circuit, a register, a communication modem, and a data processing device, and the like, known in the art to execute various control logics disclosed below.

In addition, the battery SOH estimating apparatus 100 may further include a storage unit 150. The storage unit 150 may store data necessary for operation and function of each component of the battery SOH estimating apparatus 100, data generated in the process of performing the operation or function, or the like. The storage unit 150 is not particularly limited in its kind as long as it is a known information storage means that can record, erase, update and read data. As an example, the information storage means may include RAM, flash memory, ROM, EEPROM, registers, and the like. In addition, the storage unit 150 may store program codes in which processes executable by the SOH estimating unit 110, the SOC change calculating unit 120, the weight calculating unit 130 and the SOH correcting unit 140 are defined.

Hereinafter, an embodiment in which the SOC region factor is calculated based on the SOC change region will be described.

The weight calculating unit 130 may be configured to calculate the SOC region factor according to whether at least a part of the SOC change region belongs to the criterion SOC region.

Preferably, the criterion SOC region may be configured to include a plurality of SOC regions. Accordingly, the weight calculating unit 130 may be configured to calculate the SOC region factor according to whether at least a part of the SOC change region belongs to each of the plurality of SOC regions.

Figure 3:
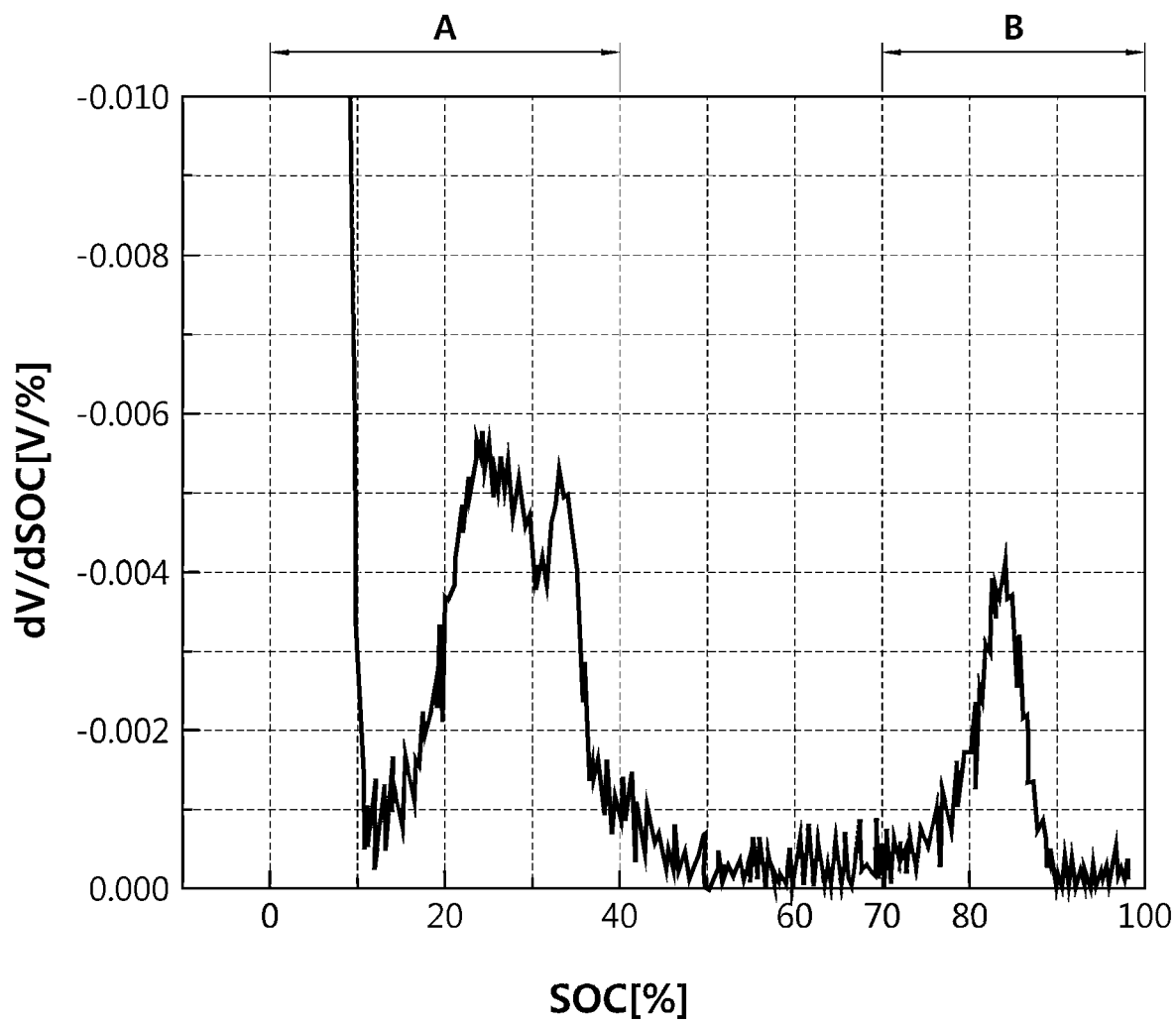
FIG. 3 is a diagram schematically showing a negative electrode differential profile of the battery.
Figures 4, 5:
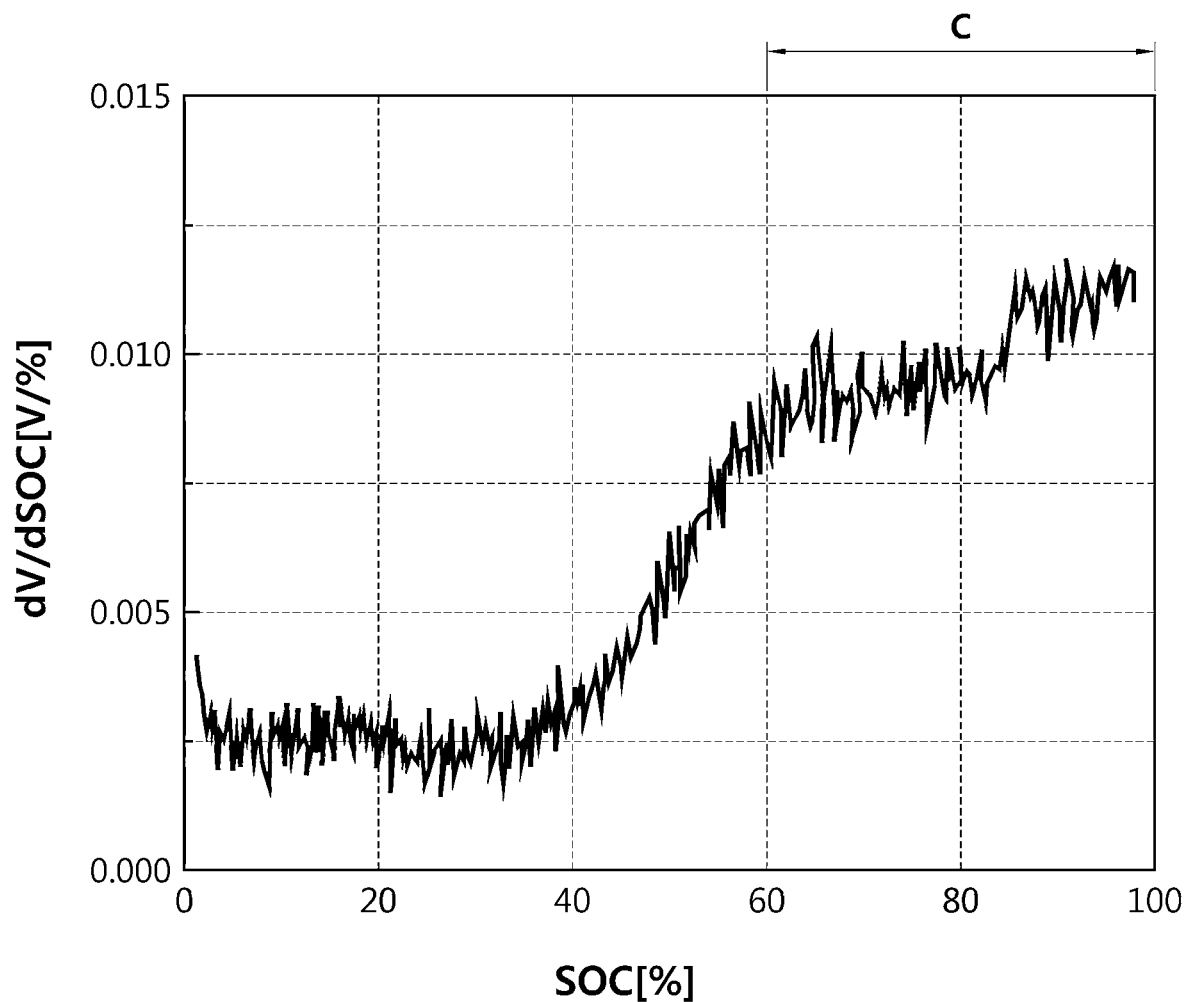
FIG. 4 is a diagram schematically showing a positive electrode differential profile of the battery.
FIG. 5 is a diagram schematically showing an example of a SOC region factor table set in the battery SOH estimating apparatus according to an embodiment of the present disclosure.

FIG. 3 is a diagram schematically showing a negative electrode differential profile of the battery. FIG. 4 is a diagram schematically showing a positive electrode differential profile of the battery.

The differential profile of FIGS. 3 and 4 is preset for a battery in a BOL state, and may be a differential profile representing a corresponding relationship between a differential voltage (dV/dSOC) for SOC and SOC. Specifically, the differential voltage may be an instantaneous change rate of the voltage (V) with respect to SOC. In addition, the differential profile may be expressed as an X-Y graph where X is SOC and Y is differential voltage (dV/dSOC).

In the negative electrode differential profile of the embodiment of FIG. 3, the intrinsic stress region of the negative electrode active material may appear in the SOC 0% to 40% region and the SOC 70% to 100% region. In addition, in the positive electrode differential profile of the embodiment of FIG. 4, the intrinsic stress region of the positive electrode active material may appear in the SOC 60% to 100% region.

Accordingly, the plurality of criterion SOC regions may be preset for each of the intrinsic stress region of the positive electrode active material and the intrinsic stress region of the negative electrode active material. For example, referring to FIGS. 3 and 4, the first criterion SOC region A may be set to the SOC 0% to 40% region, the second criterion SOC region B may be set to the SOC 70% to 100% region, and the third criterion SOC region C may be set to the SOC 60% to 100% region.

However, in the embodiments of FIGS. 3 and 4, a total of three criterion SOC regions are set for the battery, but it should be noted that the number and size of the criterion SOC regions may vary according to the change in the active material composition of the battery.

In addition, the weight calculating unit 130 may be configured to calculate the number of SOC regions including at least a part of the SOC change regions among the plurality of SOC regions, and calculate the SOC region factor according to the calculated number.

FIG. 5 is a diagram schematically showing an example of a SOC region factor table set in the battery SOH estimating apparatus 100 according to an embodiment of the present disclosure.

Specifically, the SOC region factor table of FIG. 5 may be a look-up table in which the SOC region factor is preset according to the number of SOC regions to which at least a part of the SOC change region of the battery belongs.

In the embodiment of FIG. 5, when at least a part of the SOC change region of the battery belongs to all of the first to third criterion SOC regions (A, B, C), the SOC region factor may be 1. For example, when the SOC change region of the battery is the SOC 30% to 80% region, the SOC region factor for the battery may be set to 1.

However, since the embodiment of FIG. 5 is an embodiment having three preset criterion SOC regions, it should be noted that if the number of preset criterion SOC regions is changed, the SOC region factor may also be changed accordingly. For example, unlike the embodiment of FIG. 5, it is assumed that five criterion SOC regions are set. In this case, the number of SOC regions to which at least a part of the SOC change region belongs may be 5, 4, 3, 2, or 1. The SOC region factor may be set to 1 (the number of SOC regions belonging thereto is 5), 0.8 (the number of SOC regions belonging thereto is 4), 0.6 (the number of SOC regions belonging thereto is 3), 0.4 (the number of SOC regions belonging thereto is 2), and 0.2 (the number of SOC regions belonging thereto is 1).

In general, in the course of charging and discharging the battery, the degradation of the battery may be accelerated as the SOC of the battery is included in the intrinsic stress region of the positive electrode active material and/or the intrinsic stress region of the negative electrode active material. Therefore, the battery SOH estimating apparatus 100 according to an embodiment of the present disclosure has an advantage of calculating the SOC region factor in consideration of whether the degradation of the battery is accelerated according to the intrinsic stress region of the active material in order to more accurately estimate the battery SOH.

Hereinafter, an embodiment in which the SOC change amount factor is calculated based on the SOC change amount will be described.

The weight calculating unit 130 may be configured to calculate the SOC change amount factor to be proportional to the SOC change amount.

Here, the SOC change amount is a difference between the start SOC and the end SOC of the battery in one cycle, and is calculated as "|end SOC−start SOC|", and may be expressed as ΔSOC.

Figures 6, 7, 8:
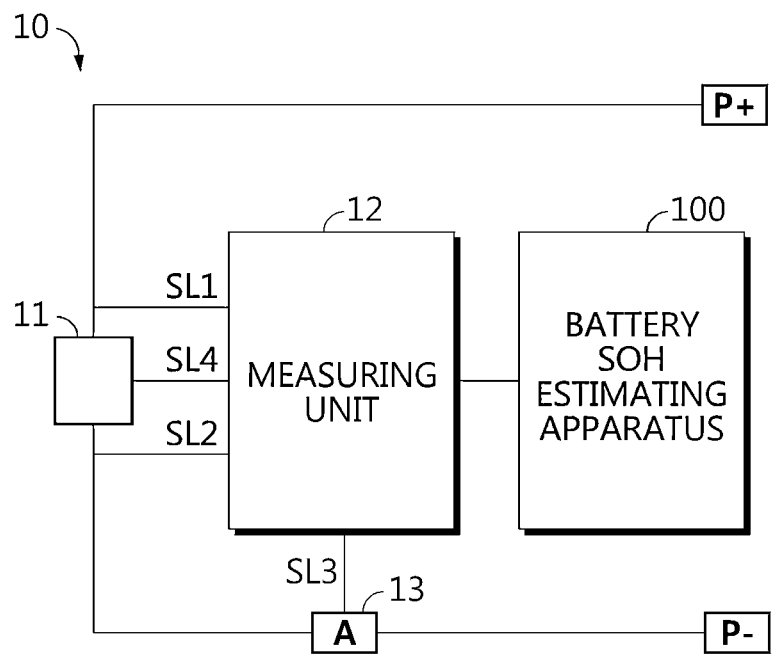
FIG. 6 is a diagram schematically showing an example of a SOC change amount factor table set in the battery SOH estimating apparatus according to an embodiment of the present disclosure.
FIG. 7 is a diagram schematically showing an example of a temperature factor table set in a battery SOH estimating apparatus according to an embodiment of the present disclosure.
FIG. 8 is a diagram schematically showing an exemplary configuration of a battery pack according to another embodiment of the present disclosure.

FIG. 6 is a diagram schematically showing an example of a SOC change amount factor table set in the battery SOH estimating apparatus 100 according to an embodiment of the present disclosure.

Specifically, the SOC change amount factor table of FIG. 6 may be a look-up table in which the SOC change amount factor is preset according to the SOC change amount of the battery.

In the embodiment of FIG. 6, the SOC change amount factor may be preset to be proportional to the SOC change amount (ΔSOC) of the battery. For example, the SOC change amount factor may be a value obtained by converting the SOC change amount (ΔSOC) to have a value of 0 to 1.

For example, as in the previous embodiment, it is assumed that the SOC change region of the battery is the SOC 30% to 80% region. In this case, the SOC change amount (ΔSOC) may be 50%. Accordingly, according to the SOC change amount factor table of FIG. 6, the SOC change amount factor for the battery may be set to 0.5.

Hereinafter, an embodiment in which the temperature factor is calculated based on the temperature of the battery will be described.

The weight calculating unit 130 may be configured to calculate the temperature factor according to a region to which the temperature of the battery belongs among a plurality of preset temperature regions.

Here, the battery temperature may be an average temperature or a maximum temperature of the battery in one cycle.

FIG. 7 is a diagram schematically showing an example of a temperature factor table set in a battery SOH estimating apparatus 100 according to an embodiment of the present disclosure.

Specifically, the temperature factor table of FIG. 7 may be a look-up table in which the temperature factor is preset according to the temperature of the battery. In addition, the temperature factor may be preset to be proportional to the temperature of the battery. For example, the temperature factor may be a value obtained by converting the temperature of the battery to have a value of 0 to 1.

In the embodiment of FIG. 7, when the temperature of the battery is 25° C. or higher, the temperature factor may be set to 1. When the temperature of the battery is 15° C., the temperature factor may be set to 0.5. When the temperature of the battery is 0° C. or below, the temperature factor may be set to 0. In addition, it should be noted that the temperature factor for the temperature of the battery not recorded in the temperature factor table of FIG. 7 may be calculated through interpolation of 0° C., 15° C., and 25° C.

For example, in each case where the temperature of the battery is 3° C., 6° C., 9° C., 12° C., 18° C., 21° C. or 24° C., the temperature factor may be 0.1, 0.2, 0.3, 0.4, 0.8 or 0.95, respectively.

The battery SOH estimating apparatus 100 according to an embodiment of the present disclosure may calculate a weight based on the temperature of the battery, the SOC change amount, and the SOC change region. That is, the battery SOH estimating apparatus 100 has an advantage of more accurately estimating the SOH of the battery by considering various factors (temperature, SOC change amount, and SOC change region) affecting the degradation of the battery. In particular, since the battery SOH estimating apparatus 100 considers the SOC change region factor caused by the intrinsic stress region of the active material, it has an advantage of reflecting the degradation acceleration factor of the battery in estimating the SOH of the battery.

The battery SOH estimating apparatus 100 according to the present disclosure may be applied to a battery management system (BMS). That is, the BMS according to the present disclosure may include the battery SOH estimating apparatus 100 described above. In this configuration, at least some of components of the battery SOH estimating apparatus 100 may be implemented by supplementing or adding functions of the components included in a conventional BMS. For example, the SOH estimating unit 110, the SOC change calculating unit 120, the weight calculating unit 130, the SOH correcting unit 140 and the storage unit 150 of the battery SOH estimating apparatus 100 may be implemented as components of the BMS.

In addition, the battery SOH estimating apparatus 100 according to the present disclosure may be provided to a battery pack. That is, the battery pack according to the present disclosure may include the above-described battery SOH estimating apparatus 100 and one or more battery cells. In addition, the battery pack may further include electrical components (a relay, a fuse, and the like) and a case.

FIG. 8 is a diagram schematically showing an exemplary configuration of a battery pack according to another embodiment of the present disclosure.

The positive electrode terminal of the battery 11 may be connected to the positive electrode terminal P+ of the battery pack 10, and the negative electrode terminal of the battery 11 may be connected to the negative electrode terminal P− of the battery pack 10.

The measuring unit 12 may be connected to the first sensing line SL1, the second sensing line SL2, the third sensing line SL3 and the fourth sensing line SL4.

Specifically, the measuring unit 12 may be connected to the positive electrode terminal of the battery 11 through the first sensing line SL1 and may be connected to the negative electrode terminal of the battery 11 through the second sensing line SL2. The measuring unit 12 may measure the voltage of the battery 11 based on the voltage measured at each of the first sensing line SL1 and the second sensing line SL2.

In addition, the measuring unit 12 may be connected to the current measuring unit 13 through the third sensing line SL3. For example, the current measuring unit 13 may be an ammeter or a shunt resistor capable of measuring the charging current and the discharging current of the battery 11. The measuring unit 12 may calculate the charge amount by measuring the charging current of the battery 11 through the third sensing line SL3. Also, the measuring unit 12 may calculate the discharge amount by measuring the discharging current of the battery 11 through the third sensing line SL3.

Also, the measuring unit 12 may measure the temperature of the battery 11 through the fourth sensing line SL4.

The voltage, current and temperature of the battery 11 measured by the measuring unit 12 may be transmitted to the battery SOH estimating apparatus 100. The battery SOH estimating apparatus 100 may estimate the SOH of the battery 11 based on the voltage, current, and temperature of the battery 11 received from the measuring unit 12.

Figure 9:
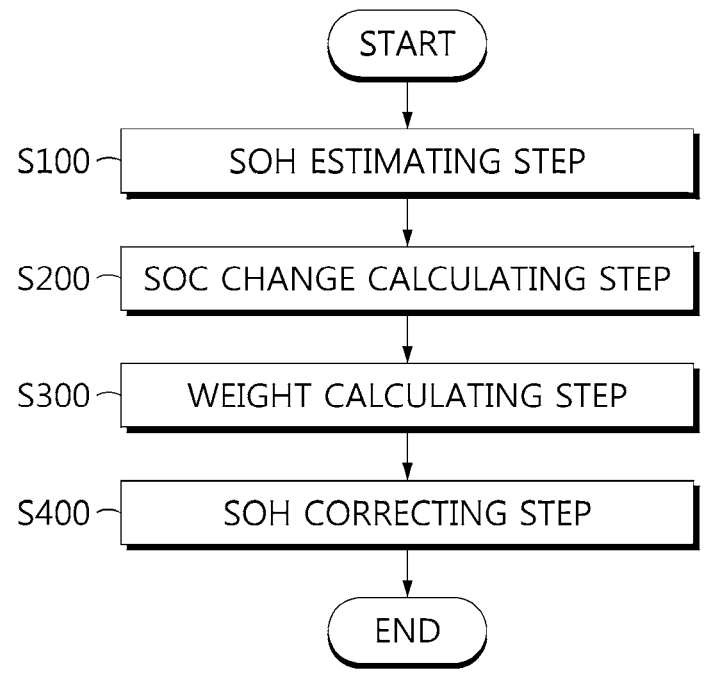
FIG. 9 is a diagram schematically showing a battery SOH estimating method according to still another embodiment of the present disclosure.

FIG. 9 is a diagram schematically showing a battery SOH estimating method according to still another embodiment of the present disclosure.

Preferably, each step of the battery SOH estimating method may be performed by the battery SOH estimating apparatus 100. Hereinafter, the content overlapping with the previously described content will be omitted or briefly described.

Referring to FIG. 9, the battery SOH estimating method may include an SOH estimating step (S100), a SOC change calculating step (S200), a weight calculating step (S300), and an SOH correcting step (S400).

The SOH estimating step (S100) is a step of estimating a first SOH of a battery based on the measured voltage and current of the battery, and may be performed by the SOH estimating unit 110.

The SOC change calculating step S200 is a step of calculating a SOC change region and a SOC change amount of the battery based on the measured voltage, and may be performed by the SOC change calculating unit 120.

The SOC change calculating unit 120 may calculate the SOC change region and the SOC change amount between the start SOC and the end SOC of the battery in one cycle, respectively.

For example, when the battery is charged from 30% SOC to 80% SOC, the SOC change calculating unit 120 may calculate the SOC change amount as 50% and calculate the SOC change region as the SOC 30% to 80% region.

For convenience of explanation, in the embodiment of FIG. 9, it is shown that the SOC change calculating step (S200) is performed after the SOH estimating step (S100), but it should be noted that the order of performing the SOH estimating step (S100) and the SOC change calculating step (S200) is not limited to the embodiment of FIG. 9. For example, after the SOC change calculating step (S200) is performed first, the SOH estimating step (S100) may be performed, or the SOH estimating step (S100) and the SOC change calculating step (S200) may be performed in parallel.

The weight calculating step (S300) is a step of calculating a weight based on a SOC region factor calculated by comparing the SOC change region with a preset criterion SOC region, a SOC change amount factor based on the SOC change amount, and a temperature factor based on the measured temperature of the battery, and may be performed by the weight calculating unit 130.

For example, the weight calculating unit 130 may calculate the SOC region factor for the SOC change region based on the SOC region factor table. Also, the weight calculating unit 130 may calculate the SOC change amount factor for the SOC change amount based on the SOC change amount factor table. Also, the weight calculating unit 130 may calculate the temperature factor for the temperature of the battery based on the temperature factor table. In addition, the weight calculating unit 130 may calculate the weight by multiplying the calculated SOC region factor, the calculated SOC change amount factor, and the calculated temperature factor.

The SOH correcting step (S400) is a step of correcting the first SOH according to the calculated weight and a preset second SOH, and may be performed by the SOH correcting unit 140.

For example, the SOH correcting unit 140 may correct the first SOH by adding a value obtained by multiplying the first SOH by a weight ($\alpha$) and a value obtained by multiplying the second SOH by a complement ($1-\alpha$) of the weight.

The embodiments of the present disclosure described above may not be implemented only through an apparatus and method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

10: battery pack
11: battery
12: measuring unit
13: current measuring unit
100: battery SOH estimating apparatus
110: SOH estimating unit
120: SOC change calculating unit
130: weight calculating unit
140: SOH correcting unit
150: storage unit

What is claimed is:

1. A battery state of health (SOH) estimating apparatus, comprising:
   a SOH estimator configured to estimate a first SOH of a battery based on measured voltage and current of the battery;
   a SOC change calculator configured to calculate a SOC change region and a SOC change amount of the battery based on the measured voltage;
   a weight calculator configured to calculate a weight based on a SOC region factor calculated by comparing the SOC change region with a preset criterion SOC region, a SOC change amount factor based on the SOC change amount, and a temperature factor based on a measured temperature of the battery; and
   a SOH corrector configured to correct the first SOH according to the calculated weight and a preset second SOH.

2. The battery SOH estimating apparatus according to claim 1,
wherein the weight calculator is further configured to calculate the SOC region factor according to whether at least a part of the SOC change region is within the criterion SOC region.

3. The battery SOH estimating apparatus according to claim 1,
wherein the criterion SOC region includes a plurality of criterion SOC regions, and
wherein the weight calculator is further configured to calculate the SOC region factor according to whether at least a part of the SOC change region is within each of the plurality of criterion SOC regions.

4. The battery SOH estimating apparatus according to claim 3,
wherein the weight calculator is further configured to calculate a number of criterion SOC regions including at least a part of the SOC change region among the plurality of criterion SOC regions, and to calculate the SOC region factor according to the calculated number.

5. The battery SOH estimating apparatus according to claim 1,
wherein the weight calculator is further configured to calculate the SOC change amount factor to be proportional to the SOC change amount, and to calculate the temperature factor according to a preset temperature region including the measured temperature of the battery among a plurality of preset temperature regions.

6. The battery SOH estimating apparatus according to claim 1,
wherein the weight calculator is further configured to calculate the weight by multiplying the SOC region factor, the SOC change amount factor, and the temperature factor.

7. The battery SOH estimating apparatus according to claim 1,
wherein the SOH corrector is further configured to correct the first SOH using the following equation:

$$SOH_{MOD}=(SOH_1 \times \alpha)+(SOH_2 \times (1-\alpha)),$$

where $SOH_{MOD}$ is the corrected first SOH, $SOH_1$ is the first SOH, $SOH_2$ is the preset second SOH, and $\alpha$ is the weight that is 0 or more and 1 or less.

8. The battery SOH estimating apparatus according to claim 1,
wherein the SOH estimator is further configured to estimate the first SOH in a present cycle based on the voltage and current of the battery measured in the present cycle, and
wherein the SOH corrector is further configured to correct the first SOH according to the weight and the preset second SOH preset prior to the present cycle.

9. The battery SOH estimating apparatus according to claim 8,
wherein the preset second SOH is the first SOH corrected in a previous cycle prior to the present cycle.

10. A battery pack, comprising the battery SOH estimating apparatus according to claim 1.

11. A battery state of health (SOH) estimating method, comprising:
estimating a first SOH of a battery based on measured voltage and current of the battery;
calculating a SOC change region and a SOC change amount of the battery based on the measured voltage;
calculating a weight based on a SOC region factor calculated by comparing the SOC change region with a preset criterion SOC region, a SOC change amount factor based on the SOC change amount, and a temperature factor based on a measured temperature of the battery; and
correcting the first SOH according to the calculated weight and a preset second SOH.

12. The battery SOH estimating method according to claim 11,
wherein the calculating of the weight includes calculating the SOC region factor according to whether at least a part of the SOC change region is within the criterion SOC region.

13. The battery SOH estimating method according to claim 11,
wherein the criterion SOC region includes a plurality of criterion SOC regions, and
wherein the calculating of the weight includes calculating the SOC region factor according to whether at least a part of the SOC change region is within each of the plurality of criterion SOC regions.

14. The battery SOH estimating method according to claim 13, wherein the calculating of the SOC region factor includes:
calculating a number of criterion SOC regions including at least a part of the SOC change region among the plurality of criterion SOC regions; and
calculating the SOC region factor according to the calculated number.

15. The battery SOH estimating method according to claim 11, wherein the calculating of the weight includes:
calculating the SOC change amount factor to be proportional to the SOC change amount; and
calculating the temperature factor according to a preset temperature region including the measured temperature of the battery among a plurality of preset temperature regions.

16. The battery SOH estimating method according to claim 11,
wherein the calculating of the weight includes calculating the weight by multiplying the SOC region factor, the SOC change amount factor, and the temperature factor.

17. The battery SOH estimating method according to claim 11,
wherein the correcting of the first SOH includes correcting the first SOH using the following equation:

$$SOH_{MOD}=(SOH_1 \times \alpha)+(SOH_2 \times (1-\alpha)),$$

where $SOH_{MOD}$ is the corrected first SOH, $SOH_1$ is the first SOH, $SOH_2$ is the preset second SOH, and $\alpha$ is the weight that is greater than equal to 0 and less than or equal to 1.

18. The battery SOH estimating method according to claim 11,
wherein the estimating of the first SOH includes estimating the first SOH in a present cycle based on the voltage and current of the battery measured in the present cycle, and
wherein the correcting of the first SOH includes correcting the first SOH according to the weight and the preset second SOH preset prior to the present cycle.

19. The battery SOH estimating method according to claim 18,
wherein the preset second SOH is the first SOH corrected in a cycle prior to the present cycle.

* * * * *